(12) United States Patent
Kirkengen et al.

(10) Patent No.: US 9,748,418 B2
(45) Date of Patent: Aug. 29, 2017

(54) SOLAR CELL AND METHOD FOR PRODUCING SAME

(75) Inventors: Martin Kirkengen, Oslo (NO); Erik Sauar, Oslo (NO)

(73) Assignee: REC SOLAR PTE. LTD., Singapore (SG)

( * ) Notice: Subject to any disclaimer, the term of this patent is extended or adjusted under 35 U.S.C. 154(b) by 129 days.

(21) Appl. No.: 14/122,625

(22) PCT Filed: May 25, 2012

(86) PCT No.: PCT/EP2012/002274
§ 371 (c)(1),
(2), (4) Date: Dec. 12, 2013

(87) PCT Pub. No.: WO2012/163517
PCT Pub. Date: Dec. 6, 2012

(65) Prior Publication Data
US 2014/0096819 A1 Apr. 10, 2014

Related U.S. Application Data

(60) Provisional application No. 61/490,955, filed on May 27, 2011.

(30) Foreign Application Priority Data

May 27, 2011 (GB) .................................... 1111302.4

(51) Int. Cl.
*H01L 31/074* (2012.01)
*H01L 31/18* (2006.01)
(Continued)

(52) U.S. Cl.
CPC .... *H01L 31/022441* (2013.01); *H01L 31/074* (2013.01); *H01L 31/075* (2013.01);
(Continued)

(58) Field of Classification Search
CPC ... H01L 31/0224; H01L 31/18; H01L 31/075; H01L 31/022441; H01L 31/0747;
(Continued)

(56) References Cited

U.S. PATENT DOCUMENTS 4,427,839 A * 1/1984 Hall ................ H01L 31/022458
136/255
5,641,362 A * 6/1997 Meier ............. H01L 31/022441
136/255
(Continued)

FOREIGN PATENT DOCUMENTS

CN 1329455 A 1/2002
CN 201364905 Y 12/2009
(Continued)

OTHER PUBLICATIONS

International Search Report, issued in PCT/EP2012/002274, dated Jan. 23, 2013.
(Continued)

*Primary Examiner* — Jeffrey T Barton
*Assistant Examiner* — Michael Y Sun
(74) *Attorney, Agent, or Firm* — Birch, Stewart, Kolasch & Birch, LLP

(57) ABSTRACT

A rear contact heterojunction solar cell and a fabricating method. The solar cell comprises a silicon substrate having a passivating layer and an intrinsic amorphous silicon layer. At a back side of the intrinsic amorphous silicon layer, an emitter layer and a base layer are provided. Interposed between these emitter and base layers is a separation layer comprising an electrically insulating material. This separation layer as well as the base layer and emitter layer may be generated by vapor deposition. Due to such processing, adjacent regions of the emitter layer and the separating layer and adjacent regions of the base layer and the separating
(Continued)

layer partially laterally overlap in overlapping areas in such a way that at least a part of the separating layer is located closer to the substrate than an overlapping portion of the respective one of the emitter layer and the base layer.

7 Claims, 3 Drawing Sheets

(51) Int. Cl.
H01L 31/075 (2012.01)
H01L 31/0747 (2012.01)
H01L 31/0224 (2006.01)

(52) U.S. Cl.
CPC .......... *H01L 31/0747* (2013.01); *H01L 31/18* (2013.01); *Y02E 10/50* (2013.01)

(58) Field of Classification Search
CPC ......... H01L 31/022458; H01L 31/0248; H01L 31/022433; H01L 31/0516; H01L 31/074; H01L 31/0745; H01L 31/077; H01L 31/02167; H01L 31/068; H01L 31/103; H01L 31/06; H01L 31/00; H01L 31/035272; H01L 31/1864; H01L 31/1804; H01L 21/266; H01L 31/03529; H01L 31/0352; Y02E 10/50; Y02E 10/547; Y02P 70/521
See application file for complete search history.

(56) References Cited

U.S. PATENT DOCUMENTS

| | | | |
|---|---|---|---|
| 6,093,882 A | | 7/2000 | Arimoto |
| 7,468,485 B1* | | 12/2008 | Swanson ........... H01L 31/03682 136/243 |
| 2007/0169808 A1* | | 7/2007 | Kherani .............. H01L 31/0745 136/258 |
| 2008/0061293 A1 | | 3/2008 | Ribeyron et al. |
| 2009/0293948 A1 | | 12/2009 | Tucci et al. |
| 2010/0032014 A1 | | 2/2010 | Bettinelli et al. |
| 2010/0055822 A1 | | 3/2010 | Weidman et al. |
| 2010/0078069 A1 | | 4/2010 | Ide |
| 2010/0206369 A1* | 8/2010 | Kim .................. H01L 31/02167 136/255 |
| 2010/0263722 A1* | 10/2010 | Kubo ................ H01L 31/02167 136/256 |
| 2010/0330730 A1 | 12/2010 | Hong et al. |
| 2011/0041908 A1 | 2/2011 | Harder |
| 2012/0073647 A1* | 3/2012 | Stangl ............ H01L 31/022441 136/256 |
| 2015/0144183 A1* | 5/2015 | Yang .................... H01L 21/266 136/252 |

FOREIGN PATENT DOCUMENTS

| | | | | |
|---|---|---|---|---|
| DE | WO2010139312 | * | 9/2010 | ......... H01L 31/0224 |
| DE | 10 2009 024 807 B3 | | 10/2010 | |
| EP | 2 200 082 A1 | | 6/2010 | |
| GB | 2503515 A | | 1/2014 | |
| JP | 2005-101240 A | | 4/2005 | |
| JP | 2005-101427 A | | 4/2005 | |
| JP | 2008-529265 A | | 7/2008 | |
| JP | 2010-034162 A | | 2/2010 | |
| JP | 2010-80887 A | | 4/2010 | |
| KR | 10-2006-0066280 A | | 6/2006 | |
| WO | WO 03/083955 A1 | | 10/2003 | |
| WO | WO 2010/137927 A2 | | 2/2010 | |
| WO | WO 2010/139312 A2 | | 12/2010 | |

OTHER PUBLICATIONS

Written Opinion of the International Search Authority, issued in PCT/EP2012/002274, dated Jan. 23, 2013.

Das et al., "Investigation of Hetero-Interface and Junction Properties in Silicon Heterojunction Solar Cells," Proceedings of 35th IEEE PVSC (Honolulu 2010).

Mingirulli et al. "Efficient Interdigitated Back-Contacted Silicon Heterjunction Solar Cells," Phys. Status Solid RRL 5:4:159-161 (2011).

O'Sullivan et al., "Interdigitated Rear Contact Solar Cells With Amophous Silicon Heterojunction Emitter," Proceedings of 35th IEEE PVSV (2010).

Shu et al., "Alternative Approches for Low Temperature Front Surface Passivation of Interdigitated Black Contact Silicon Heterojunction Solar Cell," Proceedings of 35th IEEE PVSC (2010).

\* cited by examiner

SOLAR CELL AND METHOD FOR PRODUCING SAME

CROSS REFERENCE TO RELATED APPLICATIONS

This application is the National Phase of PCT/EP/2012/002274 filed on May 25, 2012, which claims priority under 35 U.S.C. 119(e) to U.S. Provisional Application No. 61/490,955 filed on May 27, 2011 and under 35 U.S.C. 119(a) to Patent Application No. 1111302.4 filed in Great Britian on May 27, 2011, all of which are hereby expressly incorporated by reference into the present application.

FIELD OF THE INVENTION

The present invention relates to a rear contact heterojunction intrinsic thin layer silicon solar cell and a method for fabricating such solar cell.

TECHNICAL BACKGROUND

Solar cells are used to convert sunlight into electricity using a photovoltaic effect. A general object is to achieve high conversion efficiency balanced by a need for low production costs.

In order to obtain high efficiency, semiconductor materials of good quality should be used as substrates for the solar cell and the surfaces of the substrates should be highly passivated in order to minimize any recombination losses. Furthermore, contact schemes for electrically contacting the substrate should be optimized in order to minimize resistance losses and shading.

In order to keep production costs low, it is generally intended to use as few processing steps as possible and furthermore to prevent complicated and costs-intensive production steps such as e.g. photolithography masking and high temperature processing steps.

A solar cell concept has been proposed in WO 03/083955 A1. Therein, a rear-junction type photovoltaic element is proposed in which a pn junction and electrodes are formed on a rear surface opposite to a light incident surface of a semiconductor silicon substrate. The photovoltaic element has an intrinsic semiconductor film on its rear side having a thickness ranging from 0.1 nm to 50 nm. On the back side of the intrinsic semiconductor film, p-type conductive semiconductor portions and n-type conductive semiconductor portions are disposed and each of the conductive semiconductor portions is contacted with a respective first or second electrode. Such heterojunction intrinsic-thin film solar cells is sometimes referred to as HIT solar cell.

Several attempts to improve this solar cell concept and methods for fabricating such solar cells have been proposed. Therein, the fabricating methods comprise several processing steps inter alia including different approaches for passivating the substrate surface, defining the geometry of the various semiconductor electrode layers and insulator layers and/or applying electrical electrodes to the solar cell substrate. For example, it has been proposed to use expensive photolithography processing steps to precisely define areas of semiconductor layers or insulator layers on the substrate's rear surface. Furthermore, it has been proposed to locally remove previously deposited layers by locally etching in order to subsequently deposit other layer materials in the prepared openings thereby generating a desired geometry of a rear side layer arrangement.

However, it seems that all conventional approaches for generating a rear contact heterojunction intrinsic thin film solar cell scheme suffer from at least one of the following shortcomings:
- a lack of a cheap mass-production method
- poor passivation at electrode edges due to imperfect definition of electrode areas
- a risk of shunting forcing metallization only over a limited part of the electrodes
- difficulties in controlling the cleanness and deposition homogeneity of the intrinsic thin film in the critical layer closest to the substrate
- expensive layer geometry definition due to the use of lithography
- a requirement of using <100>-orientated silicon wafers as substrates.

SUMMARY OF THE INVENTION

It is an object of the present invention to at least partially overcome shortcomings of the above-mentioned prior approaches. Particularly, it may be an object of the present invention to provide a rear contact heterojunction intrinsic thin layer solar cell and a method for fabricating such solar cell allowing high solar cell efficiency while using a relatively simple and cost-efficient fabrication processing sequence.

Such objects may be achieved with the subject-matter of the independent claims. Advantageous embodiments are defined in the dependent claims.

According to a first aspect of the present invention, a rear contact heterojunction solar cell is proposed comprising a silicon substrate, a passivating layer at a front surface of the silicon substrate, a thin intrinsic amorphous silicon (i-aSi) layer covering a rear surface of the substrate and an emitter layer, a base layer and a separating layer each being provided in different areas of the back surface of the intrinsic amorphous silicon layer. The emitter layer and the base layer may be contacted with respective metal and/or conductive oxide layers and may thus form part of emitter and base electrodes.

The silicon substrate may be for example a crystalline silicon wafer. The silicon substrate may be doped with an n-type or a p-type base doping. Alternatively, the silicon substrate may comprise an intrinsic semiconductor material.

The front surface passivating layer may comprise one or more layers of e.g. amorphous silicon and/or a dielectric material serving both for passivating the front surface of the silicon substrate and, optionally, providing an antireflection coating.

The thin intrinsic amorphous silicon layer should have a very small thickness of e.g. less than 50 nm, preferably between 1 and 10 nm, such that charge carriers from the silicon substrate may tunnel through this layer while this layer may advantageously contribute to surface passivation for the rear surface of the silicon substrate. Preferably, the intrinsic amorphous silicon layer covers the entire rear surface of the substrate and may be deposited onto this rear surface in a single deposition processing step.

The emitter layer comprises a doped semiconducting material of a first doping polarity. In case the silicon substrate is made with an n-type or p-type base doping, the emitter layer may comprise a doping opposite to the base doping of the silicon substrate. The emitter layer only covers a partial portion of the back surface of the intrinsic amorphous silicon layer, hereinafter also referred as "emitter area" or "emitter electrode area".

The base layer comprises a doped semiconducting material of a second doping polarity opposite to the first doping polarity of the emitter layer and having a higher doping concentration than any base doping of the silicon substrate. The base layer covers a portion of the back surface of the intrinsic amorphous silicon layer neighbouring, but not directly adjacent to, i.e. not in mechanical contact to, the portion covered by the emitter layer, i.e. the emitter area. This surface portion is hereinafter also referred to as "base area" or "base electrode area".

The separation layer, hereinafter also sometimes referred to as "barrier layer", comprises an electrically insulating material such as intrinsic amorphous silicon and/or a dielectric material. The separation layer is arranged on a portion of the back surface of the rear intrinsic amorphous silicon layer laterally between neighbouring portions of the emitter layer and of the base layer. In other words, the separation layer is laterally interspaced between neighbouring portions of the emitter area and the base area. The associated surface portion is hereinafter also referred to as "separation area".

It may be seen as an idea underlying the present invention to provide the emitter layer, the base layer and the separation layer in a specific geometric arrangement such that adjacent regions of the emitter layer and the separating layer and adjacent regions of the base layer and the separating layer are at least partially laterally overlapping in such a way that, in the overlapping area, at least a part of the separating layer is located closer to the substrate than an overlapping portion of the respective one of the emitter layer and the base layer.

In other words, while each of the emitter layer, the base layer and the separation layer of course contact the two-dimensional surface of the underlying intrinsic amorphous silicon layer in different areas, the three-dimensional arrangement of these layers may be provided such that portions of the emitter layer and the base layer at least partially laterally overlap an underlying portion of the separation layer interspaced between these two layers.

In an embodiment, a normal originating from an outside facing surface of the separating layer has a direction component facing away from the rear intrinsic amorphous silicon layer for all locations of the surface of the separating layer not being in contact with the intrinsic amorphous silicon layer.

In other words, every portion of the surface of the separating layer which is not in direct contact with the intrinsic amorphous silicon layer more or less faces away from the intrinsic amorphous silicon layer. Again in other words, the separating layer shall have no vertical walls or overhangs, i.e. there shall be no portions of the surface of the separating layer not being in contact with the intrinsic amorphous silicon layer where a normal originating from this surface location and directing away from the layer is parallel to the surface of the intrinsic amorphous silicon layer or even directed towards this surface.

Due to such geometry of the separating layer, it is always the separating layer which is directly contacting the intrinsic amorphous silicon layer in the overlapping area where the separating layer and an adjacent base layer or an adjacent emitter layer overlap. Thus, in the overlapping area, the adjacent base layer or emitter layer is slightly spaced apart from the surface of the intrinsic amorphous silicon layer and insulated therefrom by the underlying separation layer which has a positive effect on the field effect passivation and chemical passivation of the surface of the intrinsic amorphous silicon layer as will be described later in more detail.

In an embodiment, a thickness of the separating layer is reduced at its lateral border to a negligible value in a smooth way with no sharp edges. In other words, the separating layer becomes continuously thinner towards its lateral borders but there are no steps or even overhangs in the surface of the separating layer. Lacking any sharp edges may positively influence the surface passivating properties of the separating layer.

In an embodiment, at least a part of the separating layer forms a continuous phase with the intrinsic amorphous silicon layer. The cross-section of the solar cell then shows that the intrinsic amorphous silicon layer is thinnest at the middle of electrodes contacting one of the emitter layer and the base layer and is at least 20%, preferably at least 50%, thicker towards at least one of the electrode edges and in the majority of the separating layer.

In other words, the separating layer does not necessarily have to be provided as an additional layer to the thin intrinsic amorphous silicon layer but may be part of this intrinsic amorphous silicon layer. If this is the case, the intrinsic amorphous silicon layer does not have a flat surface but, in regions which later on will electrically separate the emitter area from the base area, the intrinsic amorphous silicon layer is thicker and therefore may act like an insulating wall between these two areas. On top of the thickened area of the intrinsic amorphous silicon layer there may be further insulating layers made for example from dielectric materials thereby increasing the height of such wall.

In an embodiment, the separating layer comprises at least one layer of dielectric material having good passivating and electrically insulating property. For example, a separating layer comprising silicon rich nitride with no additional intrinsic amorphous silicon on top of the full-area intrinsic amorphous silicon layer could satisfy both the passivation and insulation requirements. An additional dielectric layer may be added on top of such passivating dielectric layer for internal reflection purposes.

In another embodiment, the separating layer consists of one layer of intrinsic amorphous silicon with good passivating properties and at least one layer of dielectric material with good optical reflection and electrical insulation properties, wherein a tail portion of the intrinsic amorphous silicon extends under and laterally overlaps with one of the adjacent base layer or emitter layer. Thereby, a positive surface passivation effect of the intrinsic amorphous silicon may be ensured.

In an embodiment, the substrate is a silicon wafer cut in the <111> crystal orientation and being polished at the rear surface. In other words, the silicon wafer provided as a substrate for the solar cell has a planar rear surface being in the <111> crystal orientation. The present solar cell concept specifically allows good surface passivation of such <111> silicon surfaces therefore resulting in high solar cell efficiencies.

In an alternative embodiment, the rear surface of the silicon substrate may have a texture. Such texture may be obtained for example by using a standard anisotropic etch on a <100>-oriented wafer, preferable followed by a subsequent soft rounding etch. While, on a substrate front surface, such texture may support trapping of incident light thereby increasing the solar cell efficiency, the solar cell concept presented herein is also compatible with such texture provided on the rear side surface of the silicon substrate. Furthermore, for example in a <100>-wafer, the textured surface resulting from a standard anisotropic etch may have pyramids or inverted pyramids all surfaces of which are <111>-orientated thereby allowing very efficient surface passivation.

According to a second aspect of the present invention, a method for fabricating a rear contact heterojunction solar cell is proposed. Therein, the rear side of the solar cell is formed by at least the following process steps, performed in the indicated order: providing a silicon substrate; depositing a thin layer of intrinsic amorphous silicon on the rear surface of the silicon substrate, preferably over the entire surface and with a thickness of less than 50 nm, preferably between 1 and 10 nm; depositing a separation layer comprising an electrically insulating material; depositing one of an emitter layer and a base layer and finally depositing the other of the emitter layer and the base layer.

Therein, the silicon substrate may be p-type, n-type or intrinsic and the separation layer comprises an electrically insulating material such as intrinsic amorphous silicon or a dielectric material such as silicon nitride, silicon oxide, silicon carbide, etc. The emitter layer comprises a doped semiconducting material of a first doping polarity and the base layer comprises a doped semiconducting material of a second doping polarity opposite to the first doping polarity and with higher doping concentration than in the silicon substrate.

One important feature of the proposed fabricating method is that each of the separation layer, the emitter layer and the base layer are deposited through a shadow mask.

Such mask may be previously fabricated with high accuracy using for example a sheet made of invar or kovar into which fine openings are prepared using laser scribing and/or etching. For ease of cleaning or preventing contamination, the mask could be covered with a nickel layer. The mask may be arranged on top of the thin full-area i-aSi layer at the rear surface of the silicon substrate during a deposition process using for example chemical vapour deposition (CVD). Thus, material is only deposited on the i-aSi layer back surface in the exposed regions of the openings in the mask whereas the other regions are protected by the mask against any layer deposition.

Using specifically adapted mask geometries, the separation layer may be deposited such that it covers only specific partial areas, i.e. the separation area, of the back surface of the intrinsic amorphous silicon layer.

After having deposited the separation layer, one of the emitter layer and the base layer may then be deposited through a mask such that it covers an emitter area or a base area of the back surface of the intrinsic amorphous silicon layer adjacent to the separation area. Finally, the other one of the emitter layer and the base layer may be deposited through a mask such that it covers a remaining emitter area or base area of the back surface of the intrinsic amorphous silicon layer adjacent to the separation portions.

Due to the fact that, first, the separation layer is deposited through a mask and only subsequently the emitter layer and the base layer are deposited through masks, it may be taken advantage from the fact that any deposition through a mask having no perfect shadow will result in the deposited layer having no step transitions at its borders. In other words, the fact that a mask generally can not cover a substrate surface perfectly results in the deposited layer having some "tails" at its borders. As the separation layer will be deposited first, the tails of the separation layer will be directly contacting the underlying intrinsic amorphous silicon layer while subsequently deposited emitter or base layers shall overlap these tails of the separation layer but will not be in direct contact with the underlying intrinsic amorphous silicon layer. Such arrangement of the separation layer and the adjacent emitter and base layers may advantageously influence the surface passivating properties of these layers as explained in further detail below.

In an embodiment, the mask used for depositing at least one of the separation layer, the base layer and the emitter layer has tilted edges, narrowest at the bottom. Such mask arrangement may allow for a sharper border definition of the layers deposited through such mask.

In an embodiment, the openings in a mask used for depositing the separation layer, when positioned for depositing the separation layer (9), partially laterally overlap openings in a mask used for depositing one of the base layer and the emitter layer. In other words, when respective masks are positioned on top of the substrate's surface for layer deposition, the areas of the openings of the respective masks relative to the substrate's surface partially laterally overlap. Due to such laterally overlapping, also the separation layer, emitter layer and base layer prepared by using such masks locally overlap resulting inter alia in advantageous surface passivation properties.

A deposition temperature during depositing the separation layer may be kept below 250° C. Due to such low deposition temperature, tails of the separation layer deposited through a mask may be kept minimal. Furthermore, a mechanical contact between the mask and the substrate could be enforced by application of electric and/or magnetic forces in order to keep tails minimal.

In an embodiment, when an alignment process of the masks used for depositing the separation layer, the emitter layer and the base layer is technically limited to a minimum alignment precision, the width and spacing of openings in the masks for depositing the separation regions each have a width and spacing of at least twice the minimum alignment precision. In other words, while the precision with which a mask may be aligned during a deposition process may be limited to e.g. a dimension d0 due to technical reasons, such alignment precision may be taken into account when designing the mask in a way such that widths dx of each of the openings in the mask and spacings dy between respective ones of neighbouring openings in the mask are chosen to be at least twice this minimum alignment, i.e. $dx > 2*d0$ and $dy > 2*d0$. Thereby, even in a case of maximum misalignment, the separation layer, the emitter layer and the base layer will sufficiently overlap at their borders such as to provide sufficient surface passivation.

In an embodiment, the same mask is used for various depositions of the separation layer deposition, the base layer deposition and the emitter layer deposition. Therein, different mask alignments are all just relative to the alignment of the first patterned layer deposition. In such arrangement, the mask may be held in place by a structure allowing a small controlled movement of the mask relative to the substrate thereby possibly simplifying the alignment procedure.

In an embodiment, the mask for depositing the separation layer contains a plurality of bridges connecting portions of the mask adjacent to an opening therein thereby allowing layer deposition under the bridge. The bridges support a mechanical stability of the mask.

In an embodiment, the mask is made of a material with a coefficient of thermal expansion same or close to that of the silicon substrate. Using a mask with such corresponding thermal expansion coefficient, any misalignment of the mask with respect to the silicon substrate due to thermal expansion during heating-up for a layer sequence deposition process may be minimized.

It may be noted that possible features and advantages of embodiments of the present invention are described herein with respect to the proposed rear contact heterojunction solar cell or with respect to the proposed method for fabricating such solar cell. One skilled in the art will recognize that the different features may be arbitrarily combined and features of the solar cell may be realized in a corresponding manner in the fabricating method and vice versa in order to implement further advantageous embodiments and realize synergetic effects.

BRIEF DESCRIPTION OF THE DRAWINGS

In the following, features and advantages of embodiments of the present invention are described with respect to the enclosed drawings. Therein, neither the description nor the drawings shall be interpreted as limiting the invention.

Figure 1:
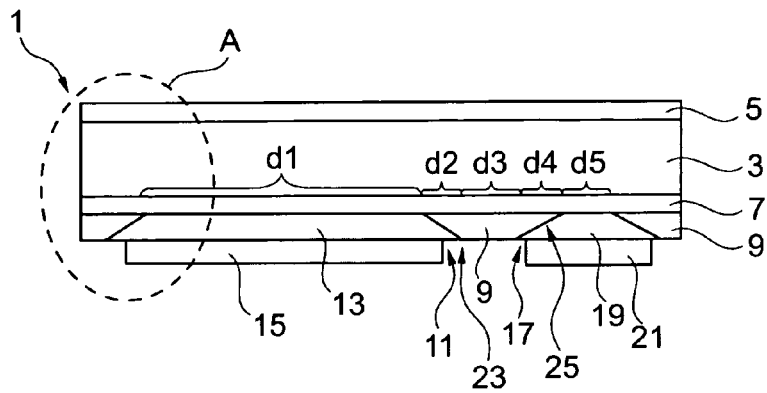
FIG. 1 shows a cross-section of a basic design of a solar cell according to an embodiment of the present invention.
Figure 2:
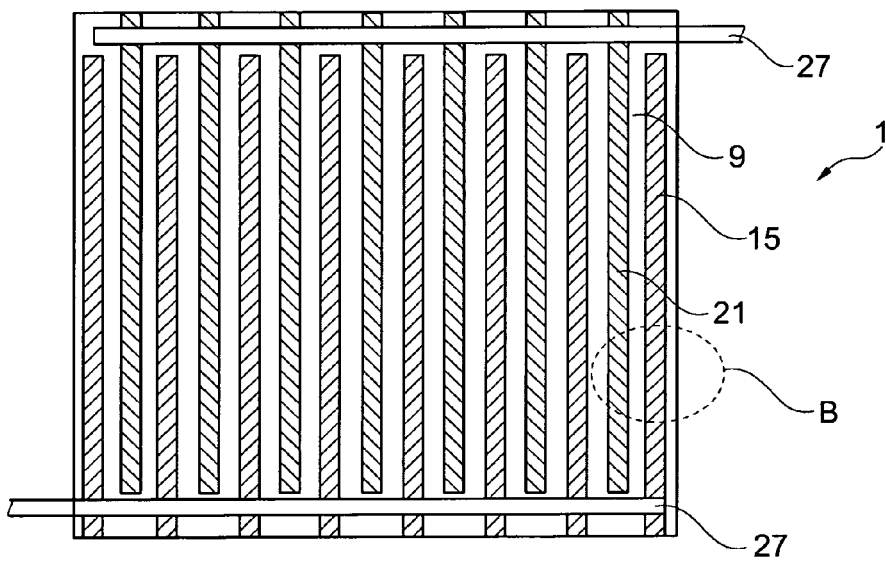
FIG. 2 shows a top view onto the rear surface of the solar cell of FIG. 1.
Figure 3:
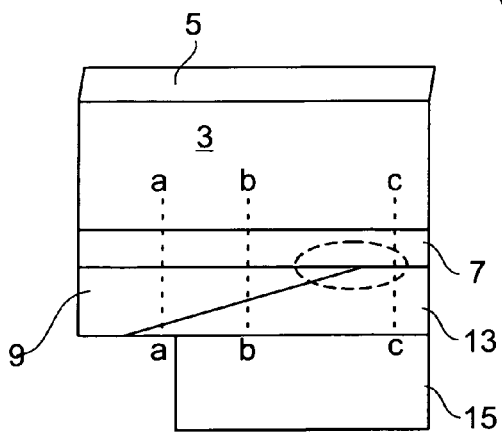
FIG. 3 shows an enlarged cross-section of the region A indicated in FIG. 1 showing an overlapping portion of the solar cell of FIG. 1.
Figure 4:
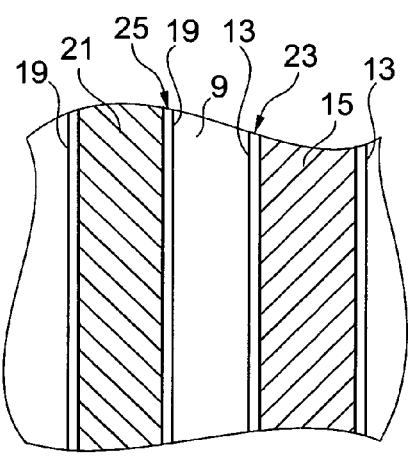
FIG. 4 shows an enlarged top view of the region B indicated in FIG. 2.

The figures are only schematical and not to scale. Same or similar features are designated with the same reference signs throughout the figures.

DESCRIPTION OF PREFERRED EMBODIMENTS

An objective of embodiments of the present invention is to provide a cost effective, industrially applicable method for fabricating back-contacted silicon heterojunction intrinsic-thin layer solar cells, and a detailed solar cell design adapted to and resulting from such a fabricating method.

In the back-contacted silicon heterojunction intrinsic-thin layer solar cells, the intrinsic layer has to be thin enough to allow tunnelling, but thick enough to passivate the adjacent silicon surface. This means that both a very low defect density and an absolute thickness control are essential. Any method that allows depositing the intrinsic layer for the entire rear surface in one go therefore has huge benefits for ease of optimization and process control in production, and is likely to have a higher maximum efficiency potential.

All existing methods for producing similar solar cells include etching through, and partially rebuilding this layer, or etching down to the layer, with risk of contamination, over-etching or giving limitations on passivation properties of the sacrificial layer.

The solar cell design should balance the need of a unit cell, i.e. of a periodicity with which cell structures periodically repeat in a lateral direction of the cell, of preferably less than 2 mm, more preferably less than 1 mm, to avoid series resistance, with a minimum alignment precision compatible with industrial high-throughput methods, typically 50 μm.

Idea of embodiments of the present invention hinge on an understanding of several vital points:

1) A deposition of first monolayers of intrinsic amorphous silicon onto the rear surface of the silicon substrate is critical. In the proposed fabricating method, these layers can be deposited before applying the shadow mask, giving uniform conditions for this passivating layer. Previous methods using etching require that the first monolayers of the different electrodes are deposited at different times and at least one through a shadow mask. The approach presented herein avoids this problem. Having the first nanometers of amorphous silicon in place before applying any mask also reduces risk of pollution or damaging of the wafer surface.

2) An (intrinsic aSi)-(doped aSi)-stack of an electrode has a double function. It is to be passivating and conductive. The passivation again depends on both a field effect passivation and a chemical passivation. When depositing a doped electrode layer using e.g. PECVD, though e.g. a photolithographically defined pattern, two things may be problematic: First, the thin layer at the edge may give insufficient band bending, and thereby poor field effect passivation. Second, any sharp edges created by a well-defined mask are likely to give imperfect chemical passivation during the subsequent deposition of the neighboring film.

3) Metal contacting of areas with imperfect thickness of the doped layer may experience a different local built-in voltage, effectively acting as a shunt. This may force the metal to be confined to a narrow strip, limiting conductance, or forcing the use of a thicker metal layer. By introducing the passivating and insulating layer around the electrodes, the metal can be deposited over a bigger area, and can therefore be thinner, meaning that evaporation sputtering or ink-jet printing becomes more attractive, avoiding the need for screen-printing.

4) Because the metal can be deposited over the full emitter area there may be no need for lateral charge carrier transport in the emitter area. This means that bulk recombination in the emitter may be reduced significantly.

5) A too thick intrinsic amorphous silicon layer, on the other hand, will not negatively affect surface passivation but may only introduce added series resistance. Having tails on the edges of the intrinsic amorphous silicon layer will only reduce the effective contact area but not reduce passivation.

6) In the conventional heterojunction cell structure, the electrode typically also contains an ITO (Indium Tin Oxide) layer. The ITO-aSi interface is likely to introduce extra series resistance. In the design proposed herein, there is no absolute need for an ITO layer and the aSi-metal contact is likely to have a significantly better conductance, reducing the need for contact area. This means that the better reflectance and passivation obtained by the passivating stack between the electrodes can be utilized even better as it can cover a larger area.

7) The process of pressing a mask against a substrate is likely to introduce a risk of breakage of the substrate. Allowing less perfect line definition in the cell design reduces this risk by reducing the needed pressing force.

8) A separation of front and rear passivation demands means that using a <111> wafer with a polished back side, where the front side texture surfaces can be of a different orientation, is made possible. The polished back side again reduces the tail formation, improving a possible maximum resolution in designing the cell geometry.

9) Alignment of the different masks used in the production process is likely to require an effort. Reducing the alignment demands by designing the cell to have soft, overlapping, edges, the alignment requirements are reduced, and brought into a mass production friendly range of e.g. approximately less than 50 µm.

10) In prior approaches, when the cell is made by forming a full-area insulating layer of i-aSi and then etching openings for the doped semiconductor areas, the sidewalls of the insulating layer can be overhanging or leave sharp edges that make it difficult to fill the space completely with the doped semiconductor.

The innovation in the proposed cell design and fabrication method is related to 1) the realization that sufficiently thin lines can be deposited by masked PECVD;
2) the sequence of the deposition of the various layers, ensuring that the soft edges of the barriers have no negative impact or even a positive impact;
3) the overlapping layers of the cell design, improving tolerances for edge definition and alignment;
4) the use of a PECVD-deposited bather layer simultaneously acting as electric insulation layer, passivation layer, reflection layer and as an aid for edge-definition of later deposited layers;
5) the realization that a PECVD-deposited barrier allows a uniform deposition of the doped semiconductor emitter and base layer regions, something that can be difficult when the openings have been obtained by etching, potentially with overhanging walls;
6) the design of a mask that makes it possible to deposit the first of these overlapping layers in one go, rather than splitting the process in multiple steps;
7) the realization that the separation of the front and rear passivation allows efficient use of a <111>-oriented wafer in this cell design.

In the following, some definitions will be used:

Wafer orientation: silicon plane parallel to the wafer cutting direction. The most common direction in monocrystalline solar cells is the <100>, but there are also wafering methods that can only give <111> oriented wafers.

Wafer doping type: Silicon wafers are in general either p-type (doped with acceptors like boron, aluminum or gallium) or n-type (doped with donors like phosphorus or arsenic).

Front side: the side of the wafer facing the light source

Rear side: the side of the wafer facing away from the light source

Rear intrinsic layer: the layer of intrinsic amorphous silicon that is shared by the base, emitter and separation regions.

Electrode: stack of
either amorphous silicon, microcrystalline silicon, silicon carbide or other semiconducting material that can be efficiently doped and has a sufficient band gap
Metal contact (possibly consisting of several layers of different metals providing diffusion barriers, electrical contact, electric lateral conductance, solderability and protection against degradation)
(optionally) a layer of transparent conductive oxide for improved passivation, open circuit voltage and/or reflection Emitter electrode: electrode where the doping is of the opposite type (donor or acceptor) of the wafer doping. If the wafer is p-type, the emitter is n-type and vice versa.

Base electrode: electrode where the doping is of the same type as the wafer doping. If the wafer is p-type, the base electrode is also p-type, but the dopant element providing the doping does not need to be the same.

Rear masked depositions: The deposition of all the dielectric layers on the rear that use shadow mask depositions.

Separation layer or Barrier: the area of the rear separating the emitter electrode from the base electrode, where a layer of passivating and reflecting material is deposited on the rear intrinsic layer.

Overlapping region or Buffer zone: the area where the barrier and the emitter electrode partially overlap, or where the barrier and the base electrode partially overlap.

Front chemical passivation layer: The first nanometers of the stack covering the front of the wafer, responsible for the chemical passivation, by reducing the defect density at the front surface of the wafer. Can be amorphous silicon, silicon rich nitride, silicon oxide, aluminum oxide or other passivating material.

Front top layers: The rest of the stack at the front side, contributing to the field effect passivation and the anti-reflection properties of the cell. Typically silicon nitride, aluminum oxide, silicon oxinitrides, silicon carbide, or stacks thereof.

Metallization: Forming the metal parts of the electrodes, by PVD, printing, or a combination of such processes.

Cross connector: Metallic part connecting several electrodes in parallel, collecting the current from a larger area than any single electrode. The cross connector must therefore have a higher conductivity than the rest of the electrode metallization, and can be formed by one of several means, including PVD, printing, soldering etc.

A rear contacted solar cell 1 according to an embodiment as depicted in FIGS. 1 to 4 comprises the following features:

A silicon wafer 3 having a net doping being either n-type or p-type

The front of the wafer being covered by a passivation layer 5 comprising a front chemical passivation layer and one or more front top layers providing good light trapping and/or field effect passivation The rear of the wafer being covered by a rear intrinsic layer 7

The rear intrinsic layer 7 being partially covered by a barrier or separation layer 9 consisting of either amorphous silicon, silicon nitride, silicon carbide, aluminum oxide or a stack of such materials providing both good passivation, sufficient electrical insulation and reflection of light The rear intrinsic layer 7 being partially covered by an emitter electrode 11 comprising an emitter layer 13 and a metal layer 15

The rear intrinsic layer 7 being partially covered by a base electrode 17 comprising a base layer 19 and a metal layer 21

The edges of the emitter electrode 11 partially overlap the separation layer 9 in an overlapping area 23

The edges of the base electrode 17 partially overlap the separation layer 9 in an overlapping area 25

Neighboring base electrodes 17 and neighboring emitter electrodes 11 are interconnected by respective cross connectors 27

In the following, details of the fabricating method and the resulting solar cell structure will be given, partially supplemented with explanations of underlying physical effects. As long as not indicated otherwise, the method steps shall be performed in the order as indicated. The entire processing sequence may comprise further method steps not indicated herein in order to further improve e.g. passivation. A challenge lies in obtaining sufficiently precise deposition of the separation layer and electrode stacks to achieve good cell efficiencies, and to obtain sufficient passivation and doping of these films. In parallel, simulations are required to determine what are the tolerable thicknesses, passivation and wafer qualities, emitter fractions etc.

I) Provision of the Silicon Substrate

A silicon wafer having a thickness of e.g. between 20 μm and 400 μm may be used as a silicon substrate. The wafer may be mono-crystalline and may have one of various crystal orientations such as <111> or <100>. Alternatively, other silicon substrates such as a silicon thin film or other crystal structures or crystal orientations may be used.

The solar cell may be based on a <100> wafer. Cleaning steps and saw damage removal may be performed. The wafer may be texture etched with a standard anisotropic etch, followed by an isotropic rounding etch resulting in a pyramid texture, where all pyramid surfaces are <111> oriented, but the bottoms of the pyramids are rounded rather than sharp. This is an ideal surface for amorphous silicon deposition, as it gives an abrupt transition to amorphous silicon. Especially for the rear intrinsic layer which needs very high precision, this may be important. The wafer could also be etched by an etch leaving an inverted pyramid texture, with the same surface orientation. This would be even better from an optical point of view Alternatively, the solar cell may be based on a <111> wafer. In this case, the front side can be etched by a plasma or laser etch, while the rear side is polished. A polished rear may be optimal for reducing edge definition problems, and gives good passivation and reflectance. The front may have to be textured to increase the optical path length of the incoming light, but because it can be passivated in any way, not just by amorphous silicon, the surface orientation of the front side is not critical.

II) Preparing a Passivating Layer at the Front of the Substrate

The front of the substrate may be covered with a passivating, non-absorbing insulator, for example aSi, SiN, SiOx, AlOx, or any combination of similar passivating materials. If desired, a high temperature can be used at this stage, as long as the rear side i-aSi is deposited after the high temperature step.

The front top layers may form an anti-reflection coating. The anti-reflection coating (ARC) could be single layer or multiple layer.

III) Depositing an Intrinsic Amorphous Silicon Layer at the Rear of the Substrate An intrinsic amorphous silicon (i-aSi) layer may be deposited over the entire rear surface of the silicon substrate using e.g. suitable vapour deposition methods such as PECVD (Plasma Enhanced Chemical Vapour Deposition). No masks have to be used.

IV) Depositing a Separation Layer at the Rear of the i-aSi Layer

An insulating separation layer may be deposited locally covering separation areas of the back surface of the previously deposited i-aSi layer using e.g. suitable vapour deposition methods such as PECVD.

The separation layer may consist of at least one barrier layer deposited before the electrode doped layers, and possibly at least one barrier layer deposited after the electrode doped layers. In this case the first layer should provide chemical passivation and edge definition, while the second layer could provide both increased reflectance and electrical insulation between electrodes and possibly a metallic cross connector. This could simplify design of the shadow mask for depositing the separation layer and could open for the alignment option described further below using the same mask for the first barrier layer and the electrodes, and then using a separate mask for the top barrier layer.

The separation layer may be deposited in multiple rounds, allowing a more stable mask. This could be desirable when going to very thin line thicknesses, or to achieve barriers in places where the geometry is more complicated than simple lines, for example under the cross connector, or at the electrode ends.

V) Depositing Electrode Layers at the Rear of the i-aSi Layer

Electrodes for both polarities are provided at the rear of the previously deposited intrinsic amorphous silicon layer. For preparing an emitter layer for the emitter electrode and a base layer for the base electrode, similar or same deposition techniques and similar or same shadow masks as used for depositing the separation layer may be used.

A p-type doped electrode may be formed using SiH4 and a boron-containing gas, like B2H6. In addition, carbon or nitrogen can be added to increase the band gap of the silicon, allowing a more microcrystalline structure, which again allows higher doping efficiency. Other gases, like argon, hydrogen etc., can be added to improve the deposition conditions, while not leaving their components in the film.

An n-type doped electrode may be formed using SiH4 and a phosphorus-containing gas, like PH3. In addition, carbon or nitrogen can be added to increase the band gap of the silicon, allowing a more microcrystalline structure, which again allows higher doping efficiency. Other gases, like argon, hydrogen etc., can be added to improve the deposition conditions, while not leaving their components in the film.

On top of respective semiconductor layers of the electrode layers, metal layers and/or transparent conductive oxide layers may be deposited using e.g. vapour deposition or sputtering techniques. Alternatively, techniques such as ink jet printing, screen printing etc. may be used.

An order of performing the various depositions on the front and rear surfaces can be alternated as needed from temperature and contamination reduction requirements, with additional cleaning steps if necessary. It can be divided in four separate parts that should not be split:

1. The deposition of the i-aSi layer on substrate rear surface will include:
   a. (optional plasma/chemical cleaning of rear surface)
   b. deposit the thin full-area rear intrinsic layer,
2. The masked layer depositions of separation layer, emitter layer and base layer:
   a. Identify the position of the wafer e.g. by optical, mechanical or other means
   b. Place a mask for the barrier deposition, matching the alignment demanded
   c. Deposit the barrier layer
   d. (Optional step, repeat the three last steps with a different mask, providing a different section of the barrier)
   e. (Optional: Again identify wafer position)

f. Place the mask for the first electrode
g. Deposit the doped part of the first electrode
h. (Again identify wafer position)
i. Place the mask for the second electrode
j. Deposit the doped part of the second electrode
k. (optional: Clean all masks for next deposition)
3. The deposition of the front chemical passivation layer:
   a. (optional plasma cleaning of front surface)
   b. deposit the 'front chemical passivation layer',
4. The deposition of the front top layer(s).

All of the depositions are assumed to be performed by a chemical vapour deposition process in a vacuum chamber. Examples of such deposition methods are direct and indirect PECVD, Hot wire CVD, expanding plasma CVD etc.

The most likely sequences will be the following:
   (3, 1, 2, 4), giving 2 flippings, but minimizing contamination from doping or other gases
   (1, 2, 3, 4), giving only one flipping, but possibly giving dopants contaminating front surface during depositions at rear
   (3, 4, 1, 2) giving the opportunity to use higher temperature for the front side depositions than the rear amorphous silicon can tolerate, which will then require cooling before later depositions. This can lead to contamination of rear surface requiring extra cleaning
   (1, 3, 2, 4), giving the same benefits as (3, 1, 2, 4).

The electrodes may be completed, preferably by PVD or some printing method, giving a conductive, possibly metallic layer allowing extracting electric current from the solar cell.

Optionally, an additional barrier layer can be added over the electrodes to protect and insulate them from a cross connector, if needed. Furthermore, metal aiding the interconnection of the cells may optionally be added as a separate step.

The finished solar cell may have the emitter and base electrodes having the shape of lines, separated by lines of separation layers. At a lateral side area of the cell, the electrodes can be connected by either a full electrode structure, or by a strip of metal, giving an interdigitated structure.

A combined width of the emitter electrode, barrier, base electrode, and barrier, i.e. the unit cell, should be less than 2 mm, preferably even less than 1 mm, to avoid resistance effects. If the doping of the wafer is low, the maximal unit cell width must also be reduced as resistance is increased. The maximum distance from any part of the wafer to the emitter electrode should be less than the diffusion length of the minority carriers in the wafer, typically less than 300 µm to avoid losses, but the cell will also function, at lower efficiency, for a higher maximal distance. The minimal width of any line is only determined by alignment tolerances and edge definition, and could conceivably be <100 µm.

A wafer may be used which is doped to a level where the solar cell will usually be working in low injection, i.e. a photogenerated carrier concentration is smaller than base doping, and the resistance is therefore dominated by the doping. In such a cell, the maximal distance to a base electrode is determined by resistivity of the wafer, and the emitter electrode area fraction should be much larger than the base electrode area fraction. This will be the case if the wafer doping is around 1e15 or higher.

Alternatively a wafer may be used which is doped to a level where the cell will be working in high injection, i.e. a photogenerated carriers concentration is larger than base doping. In such a cell, the area fractions of emitter and base contacts should be quite similar. This could be an advantage in that the metal line thickness for the base and emitter contacts could be made more similar, giving a more optimized metal thickness, higher area coverage, and in the end lower metal consumption.

The mask may be fabricated of invar, kovar, FeNi42, alumina, or any other material compatible with the intended deposition and cleaning sequence. Using a conductive or insulating mask can give differences in the depositions, both are possible.

Figure 5:
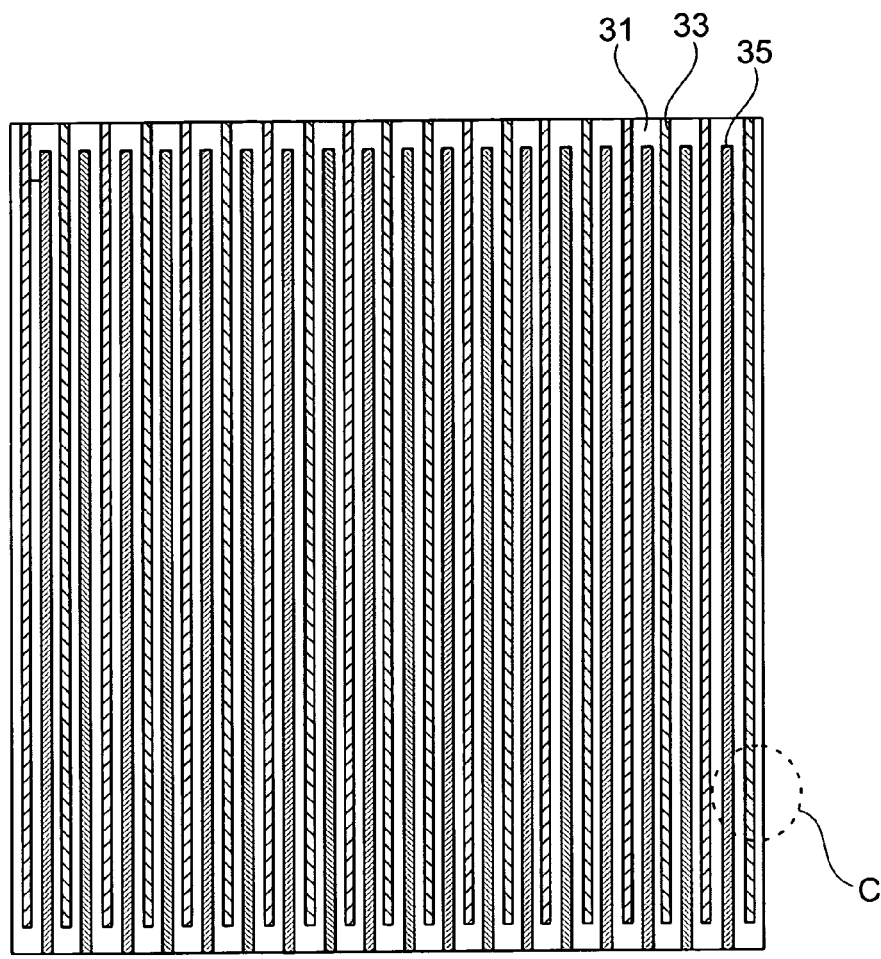
FIG. 5 shows a top view onto overlapping shadow masks usable in a fabricating method according to an embodiment of the present invention.
Figure 6:
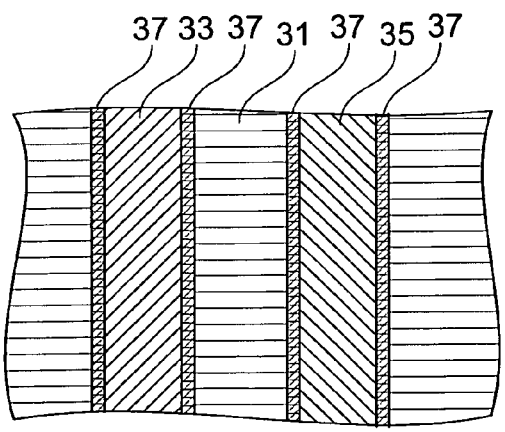
FIG. 6 shows an enlarged top view of the region C indicated in FIG. 5.

FIGS. 5 and 6 show a top view onto a possible design of shadow masks. There are three types of masks: a mask 31 for the separation layer deposition, a mask 33 for the base layer deposition and a mask 35 for the emitter layer deposition. The masks 31, 33, 35 are shown with different hatchings. A sum of the openings of all masks 31, 33, 35 covers the entire area of the rear surface of the silicon substrate. Openings in the different masks 31, 33, 35 partially overlap in regions 37. Accordingly, also the layers 9, 13, 19 deposited through such masks 31, 33, 35 partially overlap in the overlapping regions 23, 25.

Figure 7:
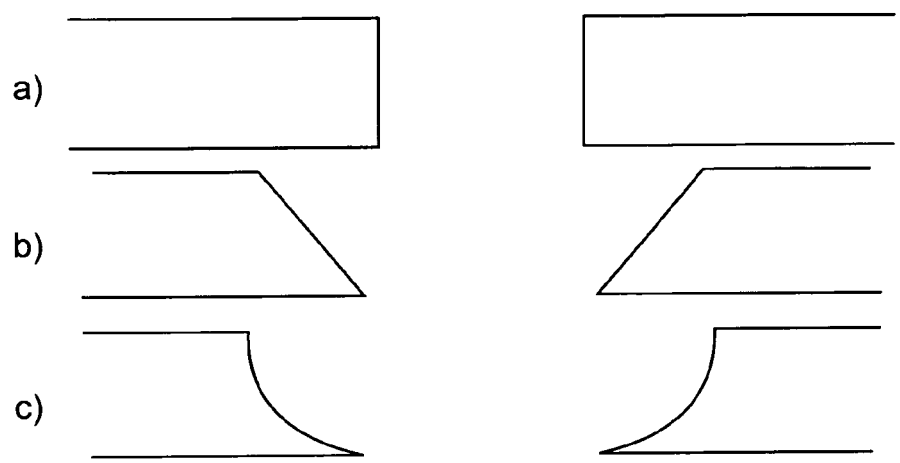
FIG. 7 a,b,c show cross-sectional profiles of shadow masks usable in a fabricating method according to an embodiment of the present invention.

Using mask openings that are narrower at the bottom of the opening than at the top, as shown in FIGS. 7b, 7c may increase the gas flow to the area where the depositions take place, and may increase the deposition rate and homogeneity. This can be achieved by using laser to dig partially through the alumina along the edges, and fully through where depositions are intended.

The mask thickness must be balanced between the need for a thick mask, to be stable and robust, versus the demands for a thin mask, reducing the height/width ratio of the openings, reducing the time to stabilize temperature, and increase deposition rate.

The first mask may involve 'bridges'. 'Bridges' mean sections where the mask is lifted off the wafer, to allow diffusion of gas, and thereby depositions, under the 'bridge', but where the bridge holds the different parts of the mask together. This allows depositing barriers around electrodes in a single step, instead of having to make two depositions to fully surround an area with barrier. It also allows the thinnest mask sections to be stabilized by more solid sections.

An alignment may be done by fitting the wafer physically into a fixed position like a dip in a carrying boat, and have the mask in a given position relative to this, or where alignment is achieved by identifying the position of the wafer by optical means and then placing the mask accordingly.

The mask for the barrier, the emitter electrode and the base electrode may be the same, so the alignment can happen at the start of the masked depositions, and then the subsequent alignments can be done by a relative displacement of the mask by a fixed amount, instead of having an absolute alignment for each step. This would allow an increased alignment tolerance relative to the wafer edge, while keeping a small alignment tolerance for the line edges within the cell. If the electrodes are intended to be wider than the barriers, the mask can be shifted to a position partially overlapping a previous deposition, and the deposition can then be repeated.

The mask may be cleaned either after each deposition, or after a large number of depositions, by e.g. a plasma clean or by a chemical clean. One option is to have a plasma cleaning chamber in parallel with the plasma deposition chamber, so that the mask will never have to leave vacuum in the whole alignment/deposition/removal/cleaning cycle. The mask would have to be made of a material resistant to the cleaning, or it could be made by one material, and then covered by a thin layer of a resistant material.

The mask may be made of a material that has the same coefficient of thermal expansion as the silicon.

The mask may be kept tight by a frame stretching the more flexible parts of the mask, so that misalignment and deformation is avoided.

For performing the various deposition processes, a deposition chamber may be provided as a sequence of chambers separated by airtight gates, so that vacuum can be maintained in one chamber while a neighboring chamber is filled with gas. The wafer can be placed on a chuck or 'boat' for transport and as support for alignment and mask placement. The boat can follow the wafer through several chambers, or it can be used for one chamber only. The boat would also protect the wafer from deposition on the down side of the wafer. The chambers can then fill different functions, either as deposition chambers, mask placement chambers, etching chambers, mask removal chambers or flipping stations. Etching chambers may exist for both masks, wafers and 'boats'. Masks can be lifted from the wafer in the mask removal chamber, then transported through a mask cleaning chamber to the mask alignment chamber. Wafer and mask can be transported from the alignment chamber, through the deposition chamber, to the mask removal chamber.

A metal connecting the electrodes of the same type may be different from the metal used in the electrode. This connecting metal, also referred to as 'cross connector', could then be soldered on, screen printed, or formed by any means seen as convenient. An advantage of this is that the conductivity in the part of the cell carrying the largest current can be increased without adding metal consumption to the rest of the cell.

Experimental Results a) Deposition of Lines of Amorphous Silicon Through Shadow Mask A mask was made by laser cutting through an alumina sheet of 200 µm thickness. Lines with width of 100, 200, 300, 400 and 500 µm were cut out.

The mask was laid to rest on a polished, clean, hydrophobic, <100>-oriented silicon wafer surface—no force was applied except gravity—the wafer was inserted into a direct PECVD chamber, with a frequency of 13.56 MHz.

The chamber was set up to deposit according to parameters known to give a relatively good amorphous silicon passivation, with the following parameters:
Deposition temperature: 200 C.
SiH4 flow, 25 sccm
Power, ramped from 20 W to 8 W (over an approx 25 cm diameter circular electrode)
pressure 300 mtorr
deposition time 15 min The sample was characterized using focused ellipsometry, alpha-step profiling and optical microscopy, and these methods showed consistent results. The maximum thickness was >30 µm, indicating that the deposition rate is somewhat less than what would have been the case without the mask, but the order of magnitude is the same. The line width of the deposited line is very close to the width of the mask opening, but the line profile is slightly rounded for thinner lines than 300 µm. There is some tail formation outside the line, but 200 µm from the line edge, there is less than 1 nm amorphous silicon. It is hard to exclude the possibility of up to 100 µm tails, as the focused ellipsometry does not have sufficient resolution, and we have not yet performed TEM. Anyway, the line definition is sufficient for a design with 300 µm line width, and could possibly allow 200 µm or even 100 µm line width.

Deposition at 200° C. seems to give sharper edge definition than deposition at 230° C. When depositing at higher temperatures, like depositing an SiN at 400° C., the tails increase drastically, and the tails become more silicon rich than the middle of the line. This is likely to be caused by the low sticking coefficient of the silicon, allowing diffusion along the surface.

b) Deposition of Lines of Amorphous Silicon Through Shadow Mask with Sloped Sidewalls The procedure followed was exactly as above, but in this case one mask had vertical edges (FIG. 7a), one had edges sloping at 45 deg (FIG. 7b), narrowest at the bottom of the mask and widest at the top, another mask was rounded to be almost U-shaped (FIG. 7c), the latter two giving better diffusion of gas down to the wafer surface than a mask with straight walls.

In this case the edge definition was better in thickness, with more homogeneous line deposited thickness, but the roughness from the laser beam spot size when making the openings was discernible in the edge of the deposited line. The needed deposition time is reduced in this case, as the deposition rate is increased. The laser-caused roughness again emphasizes the need for a design with overlapping regions.

c) Deposition of Lines of Amorphous Silicon Through Shadow Mask with 'Bridge'

Lines with bridges where the mask was dug out only partially, from the wafer side, were also produced, and then used in the same way as described above. Using a 200 µm thick mask, the bridges were fabricated to be 50 or 100 µm thick, leaving a 150 µm or 100 µm opening between mask and wafer. When the 'bridges' were 200 µm thick, and the line width >300 µm, deposition clearly occurred under the 'bridges', due to gas diffusing in under the 'bridge'.

Simulations

Simulations have been performed in the 2D simulation package ATLAS from SILVACO, showing that the contact resistance is not likely to limit the cell performance, as long as the intrinsic amorphous silicon layer can be kept around 5 nm, and the doping of the amorphous silicon is sufficient (>1e18/cm^3). The design allows great flexibility in dimensions, depending on wafer quality and passivation quality. In general, it seems that the narrower the barrier line can be, the better. So the barrier itself only appears to have a negative function in the device, if the electrodes could have been deposited in a perfect manner. The function of the barrier is therefore purely related to the ease of production.

If assuming that the barrier can have a better internal reflectance than the electrodes, this changes, and it may even be advantageous to increase the barrier width. Here many material assumptions must be made, so general geometry advice becomes difficult.

The maximal allowable distance from any point in the wafer to the emitter electrode is limited by the effective diffusion length of the minority carriers, or in other terminology, by the effective lifetime of the wafer, including front and barrier passivation quality.

The maximal distance from any point to the base electrode is limited by the resistivity of the wafer. If the wafer doping is sufficiently high, the emitter width should therefore be higher than the base width. For a wafer with very low doping, it could even be beneficial to make the emitter as narrow as deposition precision allows.

Using the best obtained line widths as input, and assuming an alignment accuracy of 50 µm can be achieved, the simulations indicate that a cell efficiency of 18-26% can be obtained, depending on passivation (3-100 cm/s) and wafer quality (0.3-3 ms), and on the light trapping achieved (36-46 mA available photocurrent).

Final Remarks

The invention relates to a production method for back contacted heterojunction intrinsic thin layer silicon cells. An Aspect of the invention is to use shadow masks for depositing both the electrodes and barriers between the electrodes. This means that the absolutely critical intrinsic thin layer can be deposited only once, and is not damaged in the later processing of the stack, as is done in every known other published production method for similar cell designs.

The main advantages of the proposed method and cell are:
1) a deposition sequence and a method partially using deposition through masks, avoiding etching steps after the first amorphous silicon (aSi) passivation, thereby increasing production speed, and reducing the issues related to interface cleaning and intrinsic aSi deposition, at the cost of increased alignment problems
2) a design of the cell allowing the necessary tolerances to misalignment that will occur in actual mass production
3) a design of the cell where the border regions between the different elements at the rear side of the cell have an overlapping structure, so that there is always at least good chemical passivation or good field effect passivation in every point of the rear side
4) a process allowing full control of the critical phases, in particular the intrinsic thin layer deposition, while lessening the control in the less critical phases of the depositions, further away from the interface with the crystalline silicon Some of the inventive contributions rely in
1) Realizing that sufficiently precise masked deposition is possible, if certain process parameters and mask demands are satisfied (confirmed by experiments and simulations)
2) Realizing that if the parts are deposited in correct order, imperfect line definition due to the masked deposition is not a problem, rather an advantage, as it gradually increases series resistance and passivation before the consequent reduction in band bending decreases passivation quality (theoretical assessment)
3) Realizing that a needed tolerance for misalignment can be achieved by introducing a sufficiently wide buffer region between the electrodes, without sacrificing too much cell efficiency (supported by simulations)

The doped aSi and other rear passivating materials are applied using (PEC)VD through masks—typically a metallic (e.g. Ni/kovar) or insulating (e.g. alumina) mask with openings of at least 100 μm determined by alignment, mask thickness and metal deposition parameters.

The alignment precision between mask and wafer (d0) is the critical design issue, and determines the minimal distances d1, d2, d3, d4, and d5 indicated in FIG. 1. They should all be >2*d0. Assuming alignment precision of 50 μm they could all be 100 μm, or they could be different values, all above 100 μm.

All these materials need to overlap as shown in the figure, so no area is left unpassivated even with maximum misalignment. This overlap is a key point of the invention.

Even though the first deposited barrier does not have perfect definition, any edges/tails of this mask layer will only improve passivation, even when covered by the electrode-forming doped aSi(or aSiC, μcSi or similar). There must only be enough area left to form good electrical contact, and in the case of the emitter, to not destroy the band bending achieved by the emitter.

In particular, if aSi is used for the mask, the contacts will be certain not to have such problems. If the texturing gives irregular edges of the tail, this is equally unproblematic, as long as the pyramid/texture tips are giving sufficient contact area.

Figure 8:
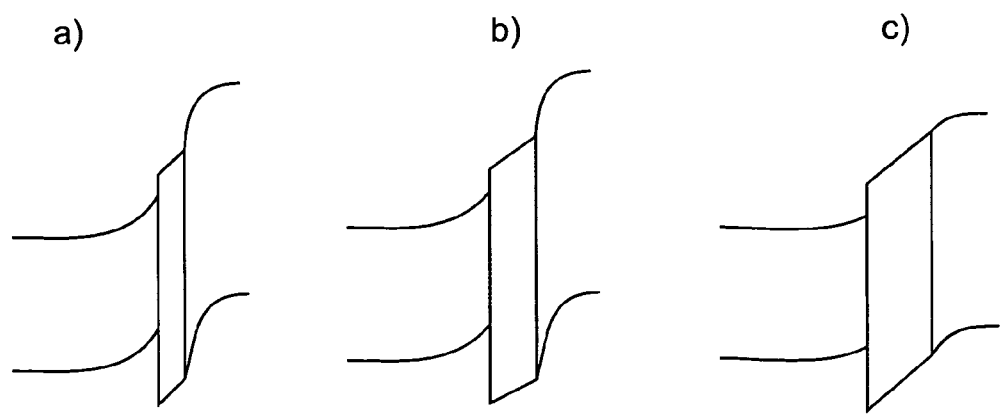
FIGS. 8 a,b,c show band diagrams for cross-sections a-a, b-b and c-c indicated in FIG. 3.

One of the key realization here is that the tunneling resistance first will increase to a level where we no longer depend on field effect passivation (FIG. 8b), then the band bending will drop to a level where the field effect passivation is removed (FIG. 8c), but because the tunneling barrier is now so big, the high number of carriers at the interface no longer matters. In a design with sharp transition, the field effect loss could happen before the chemical passivation gain, leading to high recombination.

The passivation at the contacts of a heterojunction cell is very good (FIG. 8a), therefore the series resistance is likely to be the limiting factor in choosing the contact area size. Here two series resistances compete. A large rear pitch will give high bulk resistance. A small pitch will mean that the contacted area fraction is smaller (due to the alignment limitations) and therefore the contact resistance is higher, which may be a problem.

The emitter contact fraction should probably be larger than the base contact, to reduce the required diffusion length of minority carriers, and because it is more likely to give a high resistivity.

The insulating barrier between the electrodes also reduces alignment and confinement issues for the metal contact depositions, which can be done by evaporation or sputtering. It can also be made as a stack of multiple materials, where some are optimized for passivation, others for reflection and/or electric insulation.

Finally, it should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

The invention claimed is:

1. A rear contacted heterojunction intrinsic thin layer solar cell comprising:
   a silicon substrate with a front surface and a rear surface;
   a passivating layer at the front surface of the silicon substrate;
   a continuous thin intrinsic amorphous silicon layer covering the entire rear surface of the substrate, the intrinsic amorphous silicon layer having a front surface adjacent to the rear surface of the silicon substrate and the intrinsic amorphous silicon layer having a back surface opposite to the front surface of the intrinsic amorphous silicon layer;
   an emitter layer comprising a doped semiconducting material of a first doping polarity and covering one or more portions of the back surface of the intrinsic amorphous silicon layer;
   a base layer comprising a doped semiconducting material of a second doping polarity opposite to the first doping polarity and with higher doping concentration than the silicon substrate and covering one or more portions of the back surface of the intrinsic amorphous silicon layer neighboring the portion covered by the emitter layer;
   a separating layer comprising an electrically insulating material and being arranged on one or more portions of the back surface of the intrinsic amorphous silicon layer laterally between neighboring portions of the emitter layer and portions of the base layer;

wherein adjacent regions of the emitter layer and the separating layer and adjacent regions of the base layer and the separating layer are partially laterally overlapping in such a way that, in an overlapping area, at least a portion of the separating layer is located closer to the substrate than an overlapping portion of a respective one of the emitter layer and the base layer, and that the separating layer comprises a first portion that is arranged between the silicon substrate and the base layer and a second portion that is arranged between the silicon substrate and the emitter layer.

2. The solar cell of claim 1, wherein a normal originating from an outside facing surface of the separating layer has a direction component facing away from the intrinsic amorphous silicon layer for all locations of the surface of the separating layer not being in direct contact with the intrinsic amorphous silicon layer.

3. The solar cell of one of claim 1, wherein at least a part of the separating layer forms a continuous phase with the intrinsic amorphous silicon layer thereby forming a combination intrinsic amorphous layer and wherein a cross section of the solar cell shows that the combination intrinsic amorphous silicon layer is thinnest under a middle of electrodes contacting one of the emitter layer and the base layer and is at least 20% thicker towards at least one of electrode edges and in the majority of the separating layer.

4. The solar cell of one of claim 1, wherein the separating layer comprises at least one layer of a dielectric material with good passivating and electrical insulation properties.

5. The solar cell of claim 1, wherein the separating layer consists of one layer of intrinsic amorphous silicon with good passivating properties and at least one layer of dielectric with good optical reflection and electrical insulation properties, and wherein a tail portion of the intrinsic amorphous silicon of the separating layer extends under and laterally overlaps with one of the adjacent base layer or emitter layer.

6. The solar cell of claim 1, where the substrate is a silicon wafer cut in a crystal orientation and being polished at the rear surface.

7. The solar cell of claim 1, wherein the rear surface of the silicon substrate has a texture.

* * * * *